United States Patent [19]
Lee

[11] Patent Number: 5,362,675
[45] Date of Patent: Nov. 8, 1994

[54] MANUFACTURING METHOD OF LASER DIODE AND LASER DIODE ARRAY

[75] Inventor: Song J. Lee, Kyungki, Rep. of Korea

[73] Assignee: Samsung Electronics Co., Ltd., Kyungki, Rep. of Korea

[21] Appl. No.: 995,750

[22] Filed: Dec. 24, 1992

[30] Foreign Application Priority Data

Dec. 24, 1991 [KR] Rep. of Korea ............ 24136/91
Dec. 24, 1991 [KR] Rep. of Korea ............ 24137/91

[51] Int. Cl.$^5$ ............................................. H01L 21/20
[52] U.S. Cl. ................................. 437/129; 437/130; 437/133; 437/972
[58] Field of Search ............ 437/129, 972, 133, 130, 437/117, 7

[56] References Cited

U.S. PATENT DOCUMENTS

| | | | |
|---|---|---|---|
| 4,652,333 | 3/1987 | Carney | 437/7 |
| 4,948,753 | 8/1990 | Yoshikawa et al. | 437/129 |
| 4,984,244 | 1/1991 | Yamamoto et al. | 437/129 |
| 5,023,198 | 6/1991 | Strege | 437/972 |
| 5,089,437 | 2/1992 | Shima et al. | 437/129 |
| 5,114,877 | 5/1992 | Paoli et al. | 437/129 |
| 5,143,863 | 9/1992 | Ohnaka et al. | 437/129 |
| 5,192,710 | 3/1993 | Schilling | 437/129 |

Primary Examiner—Tom Thomas
Assistant Examiner—Kevin M. Picardat
Attorney, Agent, or Firm—Cushman, Darby & Cushman

[57] ABSTRACT

A manufacturing method of a laser diode and a laser diode array is disclosed. A current blocking layer is very thinly grown on the surface of a mesa-like structure provided in a semiconductor substrate due to certain growing characteristics when forming the current blocking layer on the surface of a semiconductor substrate. Therefore, a channel is formed by utilizing the characteristic that GaAs is etched faster than AlGaAs when melt-etched by an unsaturated melted source. A first cladding layer and epitaxial layers are subsequently formed. The channel is easily formed by melt-etching because the current blocking layer is thinly formed on the surface of a reverse mesa-like structure of the semiconductor substrate. Also, a desired operation mode is freely determinable by controlling the Al mole concentration of the current blocking layer. In manufacturing the laser diode and laser diode array, melt-etching for forming the current blocking layers is performed by one epitaxy step. Accordingly, the surface of a mesa-like structure on the substrate is protected from oxidation or defects after melt-etching, thereby improving the production yield and reliability of a given device.

18 Claims, 6 Drawing Sheets

MANUFACTURING METHOD OF LASER DIODE AND LASER DIODE ARRAY

BACKGROUND OF THE INVENTION

1. Field of the Invention

The present invention relates to a manufacturing method of a laser diode ("LD") and a laser diode array ("LD array"), and more particularly, to a manufacturing method of a LD and a LD array in which production yield is greatly improved by an epitaxy step.

2. Description of the Related Art

Generally, it is necessary to stabilize a lateral mode and lower the operating current in a LD. The current is usually concentrated in a narrow region. For example, a current blocking layer is formed on the left and right of a V-channel. This LD structure is called an inner stripe-shaped configuration. Two epitaxy steps are required to grow the LD structure. The current blocking layer is grown on a substrate, and a channel is formed by etching as a first epitaxy step. Next, a double heterojunction structure is grown as a second epitaxy step.

A LD array is utilized to increase the intensity of an output base. The LD array outputs a stable beam by operating in a phase-locked state in which respective LDs are strongly coupled. There is an evanescent mode coupling by an index guide, a leakage mode coupling by an anti-guide, and a gain guide coupling (and the like) as coupling modes between respective LDs.

In the evanescent mode coupling, the effective index of a lasing region of a unit LD for generating a laser beam is bigger than that of a coupling region between neighboring LDs, so the coupling between unit LDs is not strong. On the other hand, in the leakage mode, the effective index of the coupling region is bigger than that of the lasing region, so the coupling between unit LDs is strong.

Two-step epitaxy layers have more crystalline defects because the layers are fabricated after exposure to air and etching. To solve this problem, a method for growing the LD by one-step liquid phase epitaxy (hereinafter termed "LPE") was suggested by K. Kishino, et al., *Japanese Journal of Applied Physics*, pp. L 473–L 475, July, 1983.

FIGS. 1A to 1D are sectional views showing a conventional manufacturing process of a LD by one-step LPE.

As seen from FIG. 1A, a predetermined part of N-type GaAs semiconductor substrate 11 having a (100) crystal plane is forwardly mesa-etched in a <011> direction.

As seen from FIG. 1B, first and second current blocking layers 12 and 13 of N- and P-type $Al_xGa_{1-x}As$, respectively, are fabricated. The first current blocking layer 12 is not formed on top of the mesa-like structure 11a on the semiconductor substrate 11, but formed only to the left and right of the mesa-like structure 11a.

As seen from FIG. 1C, the second blocking layer 13 is contacted with unsaturated melted material so as to form a V-channel 14 having a $<0\bar{1}1>$ direction by melt etching in situ. If the second current blocking layer 13 on the mesa-like structure surface is removed and the mesa-like structure is exposed, the semiconductor substrate 11 is etched faster than the second current blocking layer 13 to form the V-channel 14, because the melting rate of GaAs is generally 10–15 times faster than that of AlGaAs.

As seen from FIG. 1D, a first cladding layer 15 of N-type $Al_yGa_{1-y}As$, an active layer 16 of N- or P-type $Al_zGa_{1-z}As$, a second cladding layer 17 of P-type $Al_yGa_{1-y}As$, and a cap layer 18 of P+-type GaAs are sequentially deposited on the surface of the second current blocking layer 13. At this time, the first cladding layer 15 is grown faster at the V-channel 14 and finally forms a flat upper surface.

The refractive index of the active layer 16 is chosen to be greater than that of the first and second cladding layers 15 and 17 so that generated light is limited to the active layer 16. Moreover, the refractive index of the first cladding layer 15 is chosen to be greater than that of the first and second current blocking layers 12 and 13 so that the light generated from the active layer 16 is concentrated in the V-channel 14. Accordingly, x, y and z, representing the content of aluminum, should satisfy the relationship $1 \geq x > y > z \geq 0$. N-type and P-type electrodes 19 and 20 are formed on the exterior surfaces of the cap layer 18 and the semiconductor substrate 11, respectively.

In the above described method, the amount of material used in manufacturing the LD is controlled. A V-channel is formed by melt-etching in situ by virtue of the unsaturated melted material, and then the epitaxy step is performed without exposure to air, which prevents generation of crystalline defects.

A LD array having a leakage mode coupling structure is disclosed in *Appl. Phys. Lett.*, 53(6), pp. 464–466, Aug. 1988.

FIGS. 2A to 2C are sectional views showing a manufacturing method of a LD array of a conventional leakage mode coupling structure.

As seen from FIG. 2A, a first current blocking layer 22 of N-type $Al_yGa_{1-y}As$ and a second current blocking layer 23 of N-type $Al_xGa_{1-x}As$ are sequentially formed on the surface of a P+-type GaAs substrate 21 by LPE or metal organic chemical vapor deposition (hereinafter termed "MOCVD"). The first and second current blocking layers 22 and 23 are then etched to a predetermined depth to form a plurality of channels 24.

As seen from FIG. 2B, a first cladding layer 25 of P-type $Al_yGa_{1-y}As$ is formed above the second current blocking layer 23 to entirely cover the channels 24. An undoped active layer 26 of I-type $Al_zGa_{1-z}As$, a second cladding layer 27 of N-type $Al_yGa_{1-y}As$, and a cap layer 28 of N+-type GaAs are then sequentially fabricated on the surface of the first cladding layer 25. The first cladding layer 25 is grown faster in the channels and forms a flat upper surface.

The aluminum mole concentration of the first cladding layer 25 should be greater than that of the second current blocking layer 23 so that the effective index of the coupling region is greater than that of the lasing region. That is, the constant y should be greater than the constant x. The effective index of the active layer 26 is chosen to be greater than that of the first and second cladding layers 25 and 27 so that the generated light is limited to the active layer 26. Accordingly, the constants y and z should satisfy $1 \geq y > z \geq 0$.

Referring to FIG. 2C, after $SiO_2$, $Si_3N_4$, or the like is deposited on the surface of the cap layer 28, insulating layers 29 are formed at end portions of the cap layer 28 by conventional photolithography. Subsequently, N-type electrode 30 is formed on the upper exterior surface of the cap layer 28, and P-type electrode 31 is formed on the lower exterior surface of the semiconductor substrate 21.

The LD array described above is operated in a leakage mode in a state where the aluminum mole concentration of the second current blocking layer 23 is greater than that of the first cladding layer 25, and the effective index of the coupling region is greater than the lasing region.

In the conventional LD described above, the convexity of a given mesa-like structure is not high in topographical aspect because the mesa-like structure is forwardly formed, and therefore the second current blocking layer is thickly formed on the surface of the mesa-like structure due to a property of LPE growth. Further, the unsaturated level of the melting material is controlled by an amount of the material, and therefore the unsaturated level of the material is not uniform due to mass variation, etc. at the time of purification and etching of the material. The unsaturated level becomes higher to remove the second current blocking layer formed on the mesa-like structure, but the unsaturated level is not uniform, thereby diminishing the reliability of melt-etching.

Further, in the conventional LD array described above, the channel is formed by the etching between the first epitaxy step and the second epitaxy step, thereby oxidizing the etched surface or causing defects at the surface. Accordingly, the quality of layers grown by the second epitaxy step are less than optimal, diminishing the reliability of the device.

SUMMARY OF THE INVENTION

It is an object of the present invention to solve these problems and provide a manufacturing method of a LD in which a current blocking layer is thinly formed on the surface of a mesa-like structure.

It is another object of the present invention to provide a manufacturing method of a LD by which the unsaturated level of a melted material for melt-etching is controlled by a temperature gradient, thereby improving the reliability of melt-etching.

It is a further object of the present invention to provide manufacturing methods of a LD and a LD array by which an operating mode and a coupling type are freely selected by controlling aluminum mole concentration in a current blocking layer, thereby allowing easy and variable control of the characteristics of a resultant laser beam.

It is a still further object of the present invention to provide a manufacturing method of a LD array by which a surface of a mesa-like structure is protected from oxidation or defects after melt-etching, thereby improving production yield and reliability.

A manufacturing method of a LD according to the present invention comprises the steps of:

forming a second conductive current blocking layer on the surface of a first conductive semiconductor substrate having a reverse mesa-like structure;

forming a channel by melt-etching both the current blocking layer formed on the surface of the reverse mesa-like structure and the reverse mesa-like structure;

forming a first cladding layer of a first conductive type on the remaining current blocking layer so as to completely cover the channel;

forming an active layer on the first cladding layer;

forming a second cladding layer of a second conductive type on the active layer;

forming a second conductive cap layer on the second cladding layer and providing electrodes of the first and second conductive type on the lower surface of the semiconductor substrate and on the upper surface of the cap layer, respectively.

A manufacturing method of a LD array according to the present invention comprises the steps of:

forming a plurality of reverse mesa-like structures on a first conductive semiconductor substrate;

forming a second conductive current blocking layer on the surface of the semiconductor substrate;

forming channels by melt-etching both the current blocking layer formed on the surface of the reverse mesa-like structures and the reverse mesa-like structures;

forming a first cladding layer of the first conductive type on the remaining current blocking layer so as to cover the channels and have a flat surface;

forming an active layer on the first cladding layer;

forming a second cladding layer of the second conductive type on the active layer;

forming a second conductive cap layer on the second cladding layer and providing electrodes of the first and second conductive type on the lower surface of the semiconductor substrate and on the upper surface of the cap layer, respectively.

The objects and features of the present invention will become more apparent from a consideration of the following description which proceeds with reference to the accompanying drawings, in which selected embodiments are illustrated by way of example, and not by way of limitation.

DETAILED DESCRIPTION OF THE PREFERRED EMBODIMENT

A preferred embodiment of a manufacturing method of a LD and a LD array according to the present invention will be described in detail below with reference to the appended drawings.

FIGS. 3A to 3D show a manufacturing process of a LD according to a preferred embodiment of the invention. Each layer in FIGS. 3A to 3D is formed by LPE.

Figure 1A:
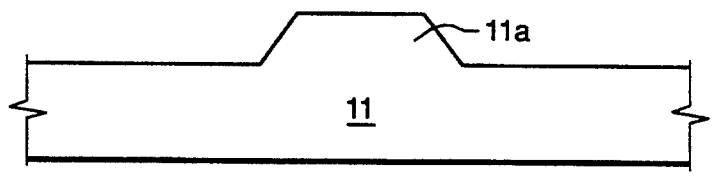
FIGS. 1A to 1D are sectional views showing a manufacturing process of a conventional LD.
Figure 1B:
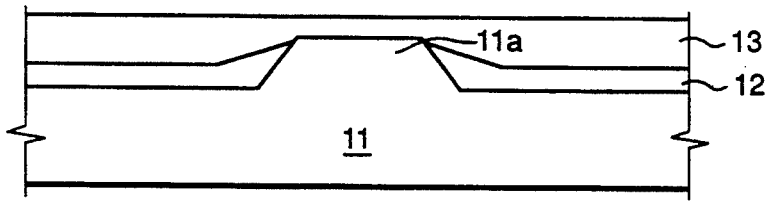
Figure 1C:
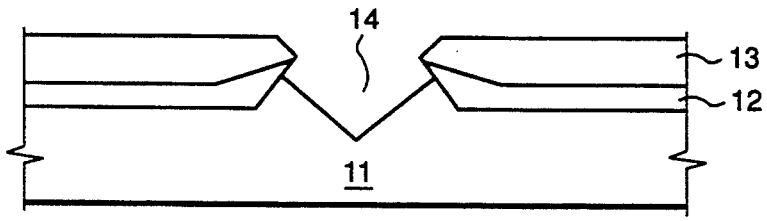
Figure 1D:
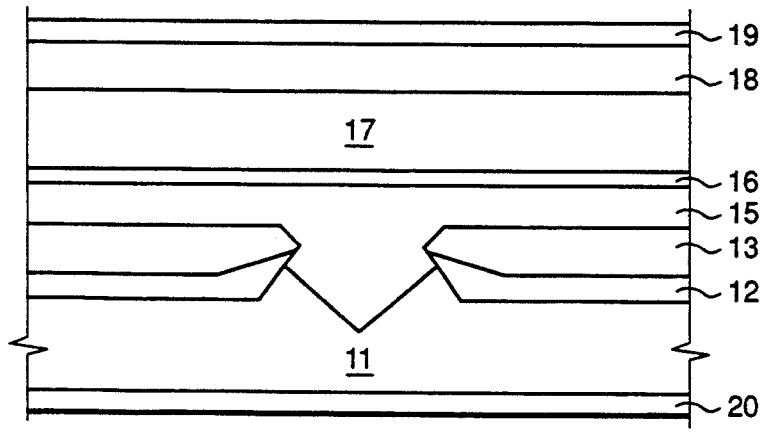
Figure 2A:
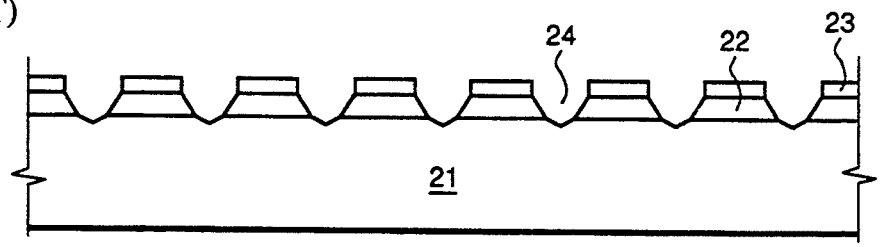
FIGS. 2A to 2C are sectional views showing a manufacturing process of a conventional LD array.
Figure 2B:
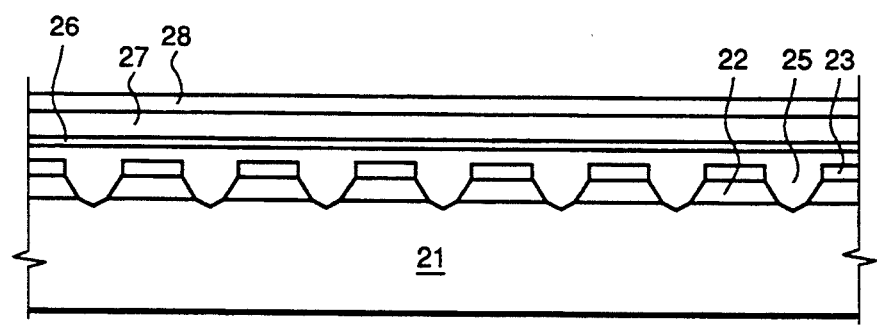
Figure 2C:
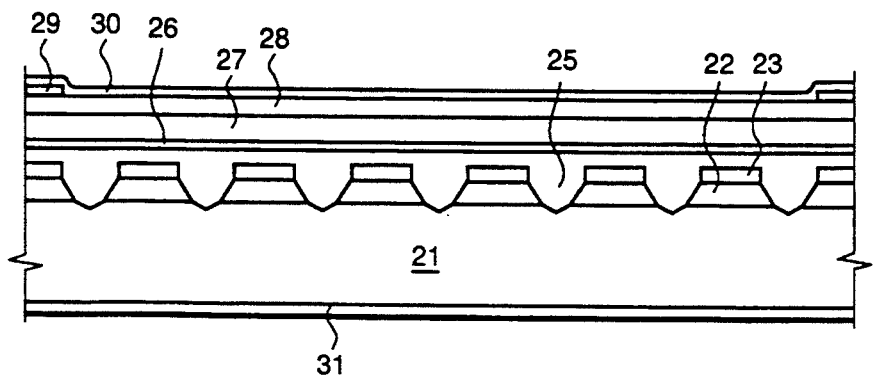
Figure 3A:
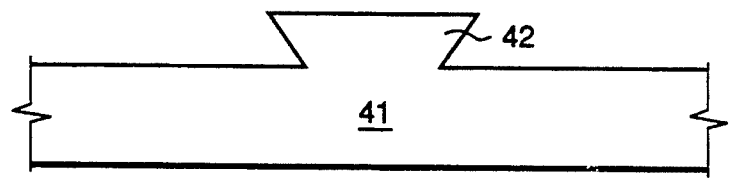
FIGS. 3A to 3D are sectional views showing a manufacturing process of a LD according to the present invention.

As shown in FIG. 3A, a predetermined part of N+-type GaAs semiconductor substrate 41 is etched in a <011> direction so as to form a reverse mesa 42. The substrate 41 has a (100) crystal plane and is doped by impurities such as Si or Te of about 1E19–1E20 ions/cm$^3$.

Figure 3B:
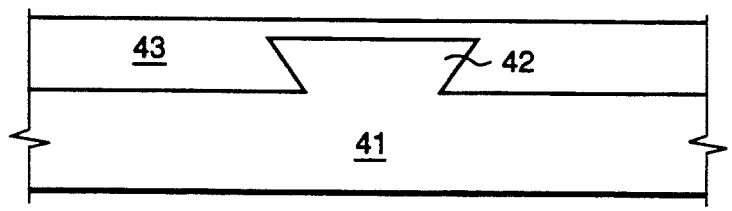

As shown in FIG. 3B, a current blocking layer 43 of P-type $Al_xGa_{1-x}As$ is grown on the semiconductor substrate 41 by LPE. The current blocking layer 43 is doped by impurities such as Ge or Zn of about 1E17–1E18 ions/cm$^3$. At this time, the convexity of reverse mesa-like structure 42 is very high. The second current blocking layer 43 is thinly formed on the surface of the reverse mesa-like structure 42 because of a low growth rate of the current blocking layer (a property of LPE growth).

Figure 3C:
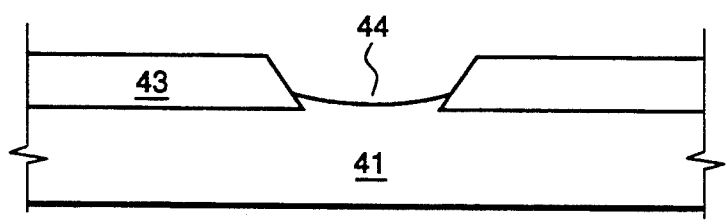

As shown in FIG. 3C, the current blocking layer 43 is contacted with an unsaturated melt source to form a channel 44 by melt-etching. At this time, if the surface of the reverse mesa-like structure 42 is exposed, the reverse mesa-like structure 42 is etched faster than the second current blocking layer 43, thus forming the channel 44. Moreover, the reverse mesa-like structure 42 is quickly exposed, and the channel 44 is easily formed because the current blocking layer 43 on the surface of the reverse mesa-like structure 42 is more thin than on other areas. Accordingly, it is possible to lower the aluminum mole concentration of the current blocking layer 43, i.e., the aluminum mole concentration of the current blocking layer can be more widely varied.

Figure 3D:
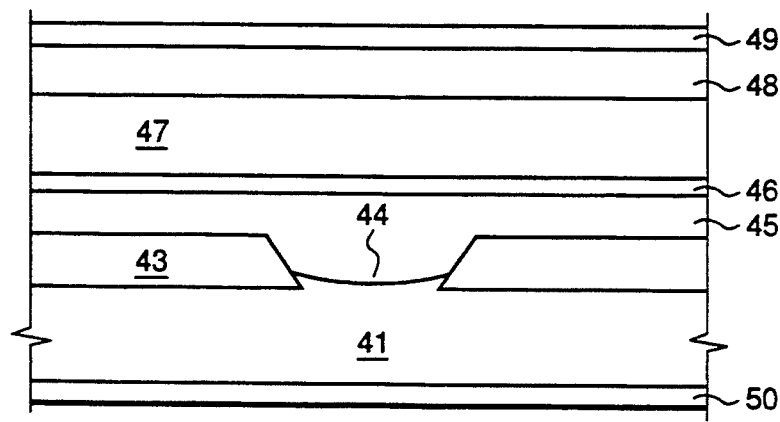

Referring to FIG. 3D, a first cladding layer 45 of N-type $Al_yGa_{1-y}As$, an active layer 46 of N- or P-type $Al_zGa_{1-z}As$, a second cladding layer 47 of P-type $Al_yGa_{1-y}As$, and a cap layer 48 of P$^+$-type GaAs are sequentially fabricated on the surface of the second current blocking layer 43.

The refractive index of the active layer 46 is chosen to be greater than that of the first and second cladding layers 45 and 47 so that the generated light is limited to the active layer 46. Accordingly, constants y and z, representing the content of aluminum, should satisfy the relationship $1 \geq y > z \geq 0$. Further, an operating mode can be selected according to the aluminum mole concentration of the first cladding layer 45 and the current blocking layer 43. The above described LD is operated in an Index Guiding mode if $x > y$, in a Gain Guiding mode if $x = y$, and in a Leakage mode if $x < y$, wherein constants x and y represent the aluminum content of the current blocking layer 43 and the first cladding layer 45, respectively.

FIGS. 4A to 4D show a manufacturing process of a LD array according to a preferred embodiment of the invention.

Figure 4A:
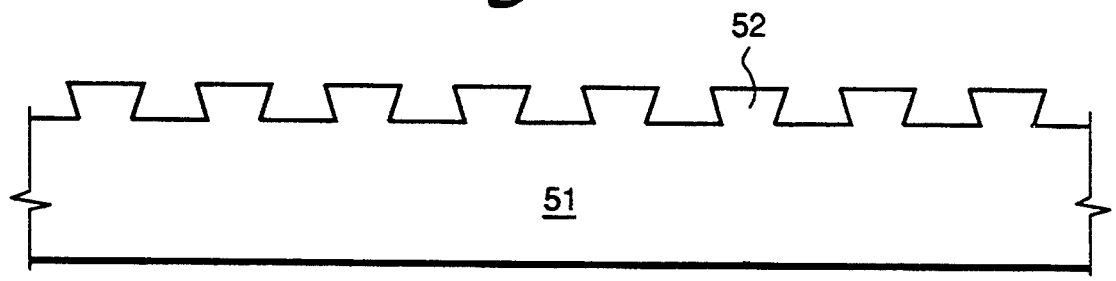
FIGS. 4A to 4D are schematic sectional views showing a manufacturing process of a LD array according to the present invention.

As shown in FIG. 4A, a predetermined part of P$^+$-type GaAs semiconductor substrate 51 is etched in a $<0\bar{1}1>$ direction to form a plurality of reverse mesa-like structures 52. Substrate 41 has a (100) crystal plane and is doped by impurities such as Zn.

Figure 4B:
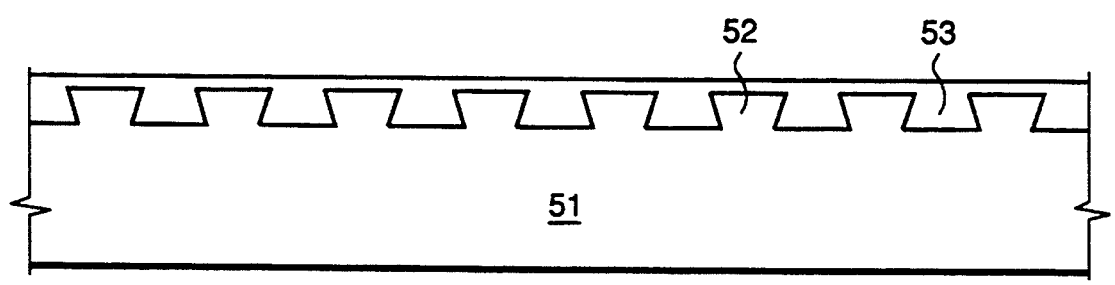

As shown in FIG. 4B, a current blocking layer 53 of N-type $Al_xGa_{1-x}As$ is formed by LPE on the semiconductor substrate 51. The current blocking layer is doped by impurities such as Tellurium (Te). At this time, the convexity of reverse mesa-like structures 52 is very high. The current blocking layer 53 is thinly formed on the surface of the reverse mesa-like structures 52 because of a low growth rate of the current blocking layer due to a property of LPE growth.

Figure 4C:
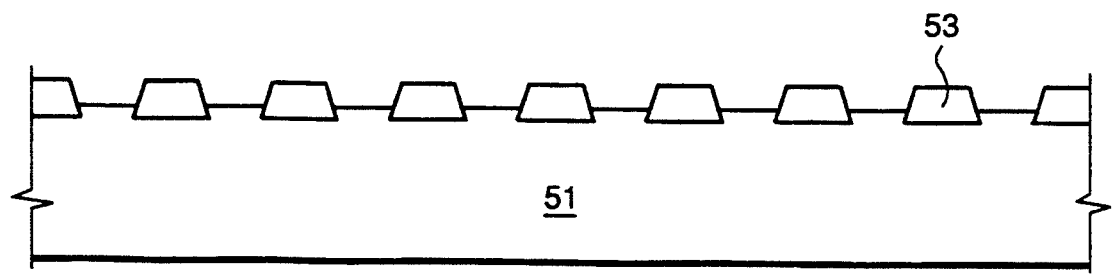

As seen from FIG. 4C, the current blocking layer 53 is contacted with an unsaturated melt source to form a plurality of channels 44 by melt-etching. At this time, as the surface of the reverse mesa-like structures 52 is exposed. The reverse mesa-like structures 52 are etched faster than the blocking layer 43, thus forming a plurality of channels 54. The etching rate of the GaAs substrate decreases as the saturation degree of the melt source increases.

Figure 4D:
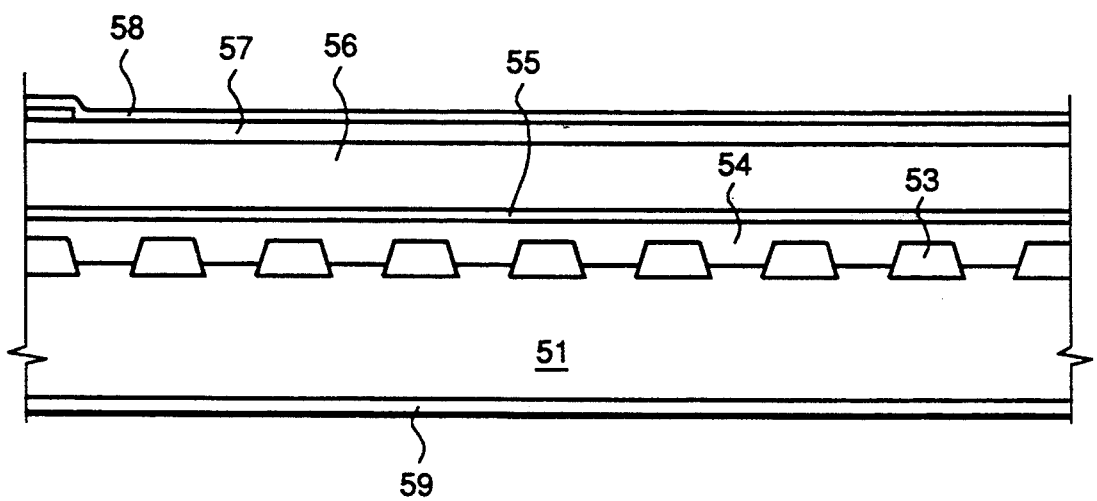

As seen from FIG. 4D, a first cladding layer 54 of P-type $Al_yGa_{1-y}As$, an active layer 55 of $Al_zGa_{1-z}As$, a second cladding layer 56 of N-type $Al_yGa_{1-y}As$, and a cap layer 57 of N$^+$-type GaAs are sequentially fabricated on the surface of the current blocking layer 53. The first cladding layer 54 is doped with impurities such as Ge or Zn, and the second cladding 56 is doped with impurities such as Te. The active layer 55 may be of P-type, N-type, or undoped I-type.

The effective index of the active layer 55 is chosen to be greater than that of the first and second cladding layers 54 and 56 so that the generated light is limited to the active layer 55. Accordingly, constants y and z should satisfy the relationship $1 \geq y > z \geq 0$. Further, a coupling type is selected according to the aluminum mole concentration of the first cladding layer 54 and the current blocking layer 53 as follows. In the above described LD, an evanescent mode coupling is formed if $x > y$, a gain guide coupling if $x = y$, and a leakage mode coupling if $x < y$, wherein constants x and y represent the aluminum content of the current blocking layer 53 and the first cladding layer 54, respectively. Subsequently, N-type electrode 58 is formed on the upper exterior surface of the cap layer 57, and P-type electrode 59 is formed on the lower exterior surface of the semiconductor substrate 51.

Figure 5:
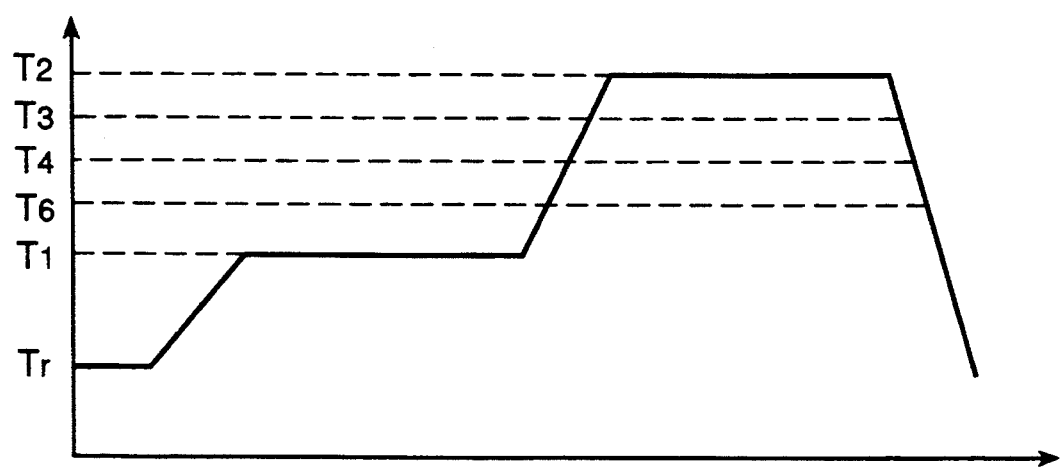
FIG. 5 is a graph showing a temperature profile during growth of epitaxial layers in the manufacturing process of a LD and a LD array according to the present invention.

FIG. 5 shows a temperature profile during the growth of epitaxial layers in the manufacturing process of a LD and a LD array according to the present invention.

$T_r$ represents a room temperature. $T_1$ represents a temperature at which a source melted for melt-etching is homogenized. $T_2$ represents a temperature at which the melted source is unsaturated and the remaining melted source for forming epitaxial layers is homogenized. $T_3$ represents a temperature at which the current blocking layer 33 is formed. $T_4$ represents a temperature at which the current blocking layer is etched by the unsaturated melt source. $T_5$ represents a temperature at which epitaxial layers, such as the first cladding layer, start to be grown.

FIGS. 6A to 6D show an operation flow of a LPE apparatus utilized for manufacture of a LD and a LD array according to the present invention. The LPE apparatus is disclosed in Korean Patent Application No. 91-7955, "A Liquid Epitaxy Apparatus and a Method for Growing an Epitaxial Layer," of the applicant. The operation flow will be described below referring to FIGS. 6A to 6B.

Figure 6A:
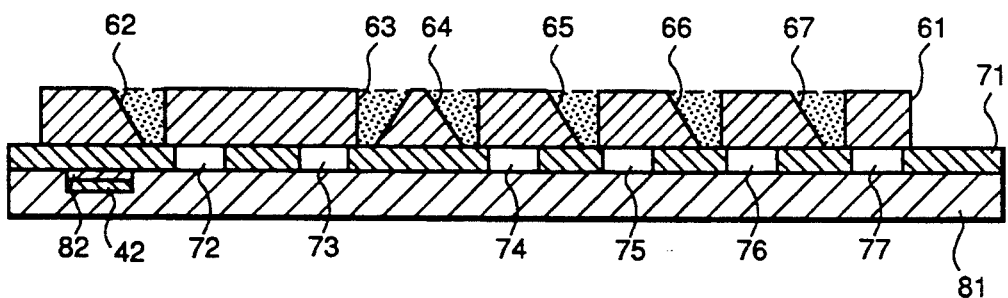
FIGS. 6A to 6D are schematic views showing an operating flow of LPE apparatus utilized for manufacturing a LD and a LD array according to the present invention.

As shown in FIG. 6A, source holders 62, 63, 64, 65, 66 and 67 formed at a source holder part 61 are filled with amorphous or polycrystalline sources. The first source holder 62 is filled with a source for forming the current blocking layer. The second source holder 63 is filled with a source for melt-etching the reverse mesa-like structure of the semiconductor substrate. The third source holder 64 is filled with a source for forming the first cladding layer. The fourth source holder 65 is filled with a source for forming the active layer. The fifth source holder 66 is filled with a source for forming the second cladding layer. The sixth source holder 67 is filled with a source for forming the cap layer. After that, the sources are heated and melted at the temperature $T_1$. At this time, the sources are sufficiently abundant to be melted in a saturated state.

Figure 6B:
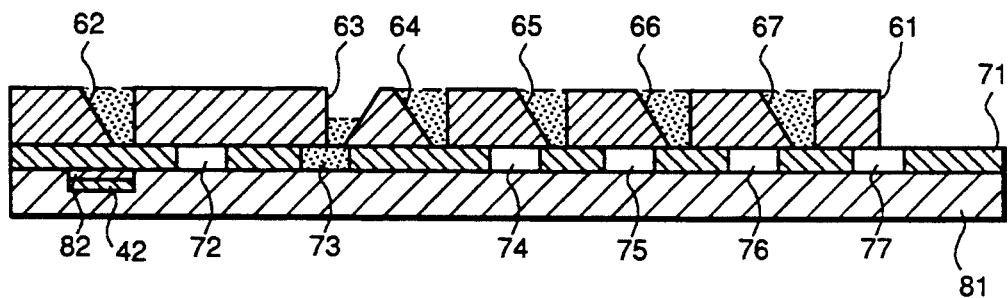

As shown in FIG. 6B, the source holder part 61 slides so that the second contacting well 73 of a contacting well part 71 is filled with the melted source of the second source holder 61 for melt-etching. The other contacting wells 72, 74, 75, 76 and 77 are yet not filled with the melted sources for forming the epitaxial layers. The melted source of the second contacting well 73 is next sufficiently homogenized at the temperature $T_1$.

Figure 6C:
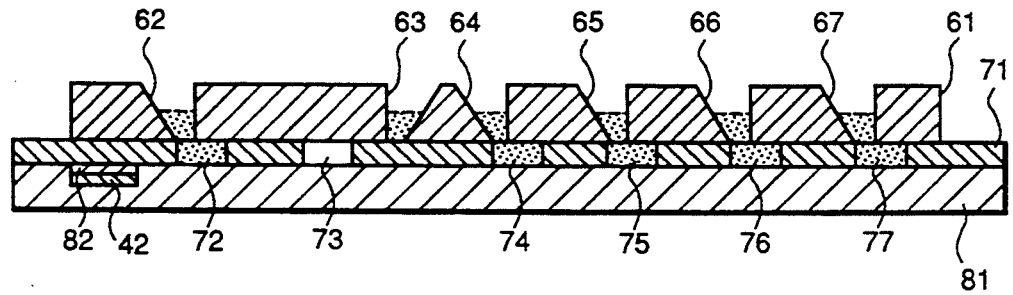

As shown in FIG. 6C, the source holder part 61 is moved in the opposite direction so that the other contacting wells 72, 74, 75, 76, 77 are filled with the melted sources of the other source holders 62, 64, 65, 66 and 67. The sources filled in the source holders 72, 74, 75, 76 and 77 are heated and sufficiently homogenized. At this time, the melted source of the second contacting well 73 is in an unsaturated state.

Figure 6D:
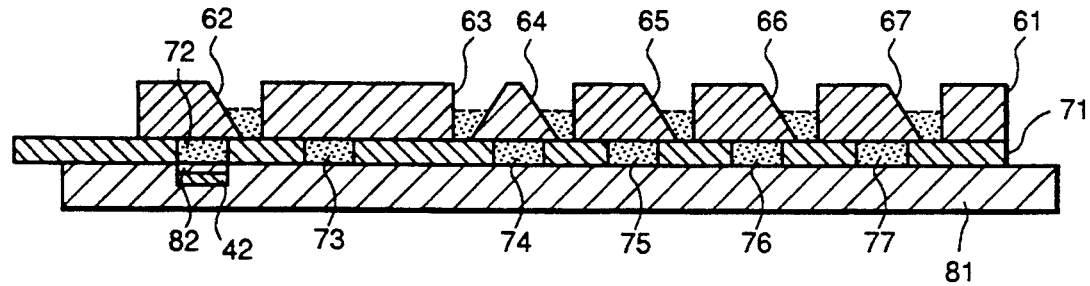

As shown in FIG. 6D, the source holder part 61 is moved again in the opposite direction so that the contacting wells 72, 74, 75, 76 and 77 are separated (i.e., moved away) from the source holders 62, 64, 65, 66 and 67.

The structure is cooled down to $T_3$ at a constant rate to moderately supersaturate the melted source in the contacting well 72. After that, a slider 81 is moved in the opposite direction so as to fit the substrate 82 to the first contacting well 72, thereby forming the current blocking layer on the surface of the semiconductor substrate. The slider is subsequently moved in the opposite direction so as to fit the substrate 82 to the other contacting wells 73, 74, 75, 76, 77, thereby contacting the substrate with the melted source at a predetermined time. The temperature $T_4$ (at which the contacting well 73 is fitted to the substrate), is set to be higher than $T_1$ in order to unsaturate the melted source for melt-etching. The other melted sources, which are homogenized at $T_2$, are supersaturated at $T_5$ to form an epitaxial layer on the semiconductor substrate during the fitting of the substrate 82 to the other contacting wells 74, 75, 76, 77.

As described above, the current blocking layer is very thinly grown on the surface of the mesa-like structure on the semiconductor substrate due to unique growing characteristics. Therefore, the channel is formed by utilizing the fact that GaAs is etched faster than AlGaAs when melt-etched by the unsaturated melted source. The first cladding layer and the epitaxial layers are subsequently formed. At this time, an operation mode and a coupling type can be controlled.

According to the present invention, in manufacturing a LD and a LD array, melt-etching to form the current blocking layers is performed by one step of epitaxial layer. Accordingly, a surface of a mesa-like structure is prevented from undergoing oxidation or defects after etching by melt-etching, thereby improving the yield and reliability of a device.

Further, according to the present invention, a coupling type is freely selected by controlling the aluminum mole concentration of the first cladding layer and current blocking layers, thereby allowing easy and variable control of the characteristics of a laser beam.

Further, according to the present invention, the channel is easily formed by melt-etching because the current blocking layer is thinly formed on the surface of the reverse mesa-like structure of the semiconductor substrate.

Further, according to the present invention, the unsaturated level of a melting material for melt-etching can be easily and exactly controlled by a temperature gradient, thereby improving the reliability of melt-etching, and a desired operation mode is freely determined by controlling the Al mole concentration of the current blocking layer.

N-type GaAs is applied as a semiconductor substrate in the above described embodiment, but P-type GaAs or another compound semiconductor such as InP or GaP are adaptable within the scope of the present invention.

The present invention is in no way limited to the embodiments described hereinabove. Various modifications of disclosed embodiment of the present invention will become apparent to persons skilled in the art upon reference to the description of the present invention. Therefore, the appended claims will cover any such modifications or embodiments as fall within the true scope of the present invention.

What is claimed is:

1. A method of manufacturing a laser diode comprising the steps of:
   forming a second conductive type current blocking layer on the surface of a first conductive type semiconductor substrate having a reverse mesa-like structure;
   forming a channel by melt-etching both said current blocking layer and said reverse mesa-like structure;
   forming a first cladding layer of the first conductive type to completely cover said channel;
   forming an active layer on said first cladding layer;
   forming a second cladding layer of the second conductive type on said active layer;
   forming a conductive cap layer on said second cladding layer; and
   providing electrodes of first and second conductive type on a lower exterior surface of said semiconductor substrate and on an upper exterior surface of said cap layer, respectively.

2. The manufacturing method of a LD according to claim 1, wherein the formation of said current blocking layer, said first cladding layer, said active layer, said second cladding layer, and said cap layer, as well as said melt-etching are completed by one step of a Liquid Phase Epitaxy ("LPE").

3. The manufacturing method of a LD according to claim 1, wherein said semiconductor substrate is made of GaAs.

4. The manufacturing method of a LD according to claim 1, wherein said current blocking layer is made of $Al_xGa_{1-x}As$, and said cladding layer is made of $Al_yGa_{1-y}As$.

5. The manufacturing method of a LD according to claim 4, wherein an operation mode is determined by control of Al mole concentration in said current blocking layer and said cladding layer.

6. The manufacturing method of a LD according to claim 5, wherein the concentration of Al in the current blocking layer is greater than the concentration of Al in the cladding layer.

7. The manufacturing method of a LD according to claim 5, wherein the concentration of Al in the current blocking layer is greater than the concentration of Al in the cladding layer.

8. The manufacturing method of a LD according to claim 5, wherein the concentration of Al in the current blocking layer is greater than the concentration of Al in the cladding layer.

9. The manufacturing method of a LD according to claim 1, wherein said melt-etching is performed at higher temperature than the temperature at the time of homogenizing of the source.

10. A manufacturing method of a LD array comprising the steps of:
- forming a plurality of reverse mesa-like structures on a first conductive type semiconductor substrate;
- forming a second conductive type current blocking layer on the surface of said semiconductor substrate;
- forming a plurality of channels by melt-etching said current blocking layer structures and said reverse mesa-like structures;
- forming a first cladding layer of said first conductive type on the blocking layer;
- forming an active layer on said first cladding layer;
- forming a second cladding layer of said second conductive type on said active layer;
- forming a conductive cap layer on said second cladding layer; and
- providing electrodes of the first and second conductive type on the lower exterior surface of said semiconductor substrate and on the upper exterior surface of said cap layer, respectively.

11. The manufacturing method of a LD array according to claim 10, wherein the formation of said current blocking layer, said first cladding layer, said active layer, said second cladding layer, and said cap layer, as well as said melt-etching are completed by one step of a LPE.

12. The manufacturing method of a LD array according to claim 10, wherein said semiconductor substrate is made of GaAs.

13. The manufacturing method of a LD array according to claim 10, wherein said current blocking layer is made of $Al_xGa_{1-x}As$, and said cladding layer is made of $Al_yGa_{1-y}As$.

14. The manufacturing method of a LD array according to claim 13, wherein an operation mode is determined by control of the Al mole concentration of said current blocking layer and said cladding layer.

15. The manufacturing method of a LD array according to claim 14, wherein concentration of Al in the current blocking layer is greater than the concentration of Al in the cladding layer.

16. The manufacturing method of a LD array according to claim 14, wherein the concentration of Al in the current blocking layer is greater than the concentration of Al in the cladding layer.

17. The manufacturing method of a LD array according to claim 14, wherein the concentration of Al in the current blocking layer is greater than the concentration of Al in the cladding layer.

18. The manufacturing method of a LD array according to claim 14, further comprising the step of providing an insulating layer on said cap layer.

* * * * *